(12) United States Patent
Pham et al.

(10) Patent No.: US 9,318,451 B2
(45) Date of Patent: Apr. 19, 2016

(54) WIREBOND RECESS FOR STACKED DIE

(71) Applicants: Tim V. Pham, Austin, TX (US); Michael B. McShane, Austin, TX (US); Perry H. Pelley, Austin, TX (US); Tab A. Stephens, Austin, TX (US)

(72) Inventors: Tim V. Pham, Austin, TX (US); Michael B. McShane, Austin, TX (US); Perry H. Pelley, Austin, TX (US); Tab A. Stephens, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 59 days.

(21) Appl. No.: 14/068,637

(22) Filed: Oct. 31, 2013

(65) Prior Publication Data

US 2015/0115474 A1  Apr. 30, 2015

(51) Int. Cl.
| | | |
|---|---|---|
| H01L 23/48 | (2006.01) | |
| H01L 23/52 | (2006.01) | |
| H01L 23/02 | (2006.01) | |
| H01L 23/00 | (2006.01) | |
| H01L 25/065 | (2006.01) | |
| H01L 29/06 | (2006.01) | |

(52) U.S. Cl.
CPC .............. *H01L 24/02* (2013.01); *H01L 24/48* (2013.01); *H01L 24/80* (2013.01); *H01L 24/92* (2013.01); *H01L 25/0657* (2013.01); *H01L 24/29* (2013.01); *H01L 24/32* (2013.01); *H01L 24/45* (2013.01); *H01L 24/83* (2013.01); *H01L 24/85* (2013.01); *H01L 29/0657* (2013.01); *H01L 2224/04* (2013.01); *H01L 2224/04042* (2013.01); *H01L 2224/2919* (2013.01); *H01L 2224/32145* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48145* (2013.01); *H01L 2224/48227* (2013.01); *H01L 2224/48465* (2013.01); *H01L 2224/73265* (2013.01); *H01L 2224/80001* (2013.01); *H01L 2224/92165* (2013.01); *H01L 2225/0651* (2013.01); *H01L 2225/06506* (2013.01); *H01L 2924/10156* (2013.01); *H01L 2924/10158* (2013.01); *H01L 2924/12042* (2013.01); *H01L 2924/15311* (2013.01)

(58) Field of Classification Search
CPC ......... H01L 33/00; H01L 24/02; H01L 24/80; H01L 25/0657; H01L 2224/04; H01L 2224/80001
USPC ................... 257/777, 703, 704, 685, 68, 738, 257/E21.499, 23.09 E; 438/109, 26, 127, 438/460
See application file for complete search history.

(56) References Cited

U.S. PATENT DOCUMENTS

| | | | |
|---|---|---|---|
| 7,344,969 B2 | 3/2008 | Tan et al. | |
| 2004/0009631 A1* | 1/2004 | Connell et al. | 438/127 |
| 2004/0069988 A1* | 4/2004 | Lin et al. | 257/48 |
| 2005/0023677 A1* | 2/2005 | Zhao et al. | 257/734 |
| 2005/0104183 A1* | 5/2005 | Kuroda et al. | 257/686 |
| 2008/0237887 A1 | 10/2008 | Takiar et al. | |
| 2009/0051043 A1 | 2/2009 | Wong et al. | |

(Continued)

*Primary Examiner* — Amar Movva
*Assistant Examiner* — Sheikh Maruf (57) ABSTRACT

A first semiconductor device die is provided having a bottom edge incorporating a notch structure that allows sufficient height and width clearance for a wire bond connected to a bond pad on an active surface of a second semiconductor device die upon which the first semiconductor device die is stacked. Use of such notch structures reduces a height of a stack incorporating the first and second semiconductor device die, thereby also reducing a thickness of a semiconductor device package incorporating the stack.

19 Claims, 5 Drawing Sheets

(56) References Cited

U.S. PATENT DOCUMENTS

| | | | |
|---|---|---|---|
| 2009/0121615 A1* | 5/2009 | Le Toquin | 313/503 |
| 2009/0243064 A1 | 10/2009 | Camacho et al. | |
| 2010/0123234 A1* | 5/2010 | Chou | 257/686 |
| 2011/0001240 A1* | 1/2011 | Merilo et al. | 257/738 |
| 2011/0215355 A1* | 9/2011 | van De Ven et al. | 257/98 |
| 2011/0316158 A1 | 12/2011 | Chin et al. | |
| 2012/0113617 A1* | 5/2012 | Kelso et al. | 362/84 |
| 2014/0264383 A1* | 9/2014 | Kajiwara et al. | 257/77 |

* cited by examiner

WIREBOND RECESS FOR STACKED DIE

BACKGROUND

1. Field

This disclosure relates generally to semiconductor device packaging, and more specifically, to stacking multiple semiconductor device die while minimizing stack thickness.

2. Related Art

Semiconductor device packaging often involves incorporating multiple semiconductor device die having a variety of functionalities in an encapsulant, so that multi-functional packages can be provided as a unit. As demands for greater functionality in smaller and smaller devices increases, a goal of semiconductor device packaging is to incorporate the desired number of semiconductor device die in as dimensionally small a package as possible. Package thickness can be reduced by reducing thicknesses of various semiconductor device die stacked in the package, which can thereby reduce encapsulant thickness. One challenge is that each semiconductor device die must retain functionality, while reducing dimensionality.

In addition, electrical contacts on the various semiconductor device die are often connected to substrate contacts or contacts on other semiconductor device die in the stack through the use of wire bonds. In order to provide sufficient space for wire bonds to be formed and routed, die spacers are often utilized, which increases thickness of the stack, or smaller die are stacked on the top of the stack, which reduces options in how a stack is formed and can cause issues with stacks formed of equal sized die.

It is desirable to provide stacked die packages that are reduced in thickness while still allowing for formation of wire bonds between semiconductor device die and a package substrate or other semiconductor device die.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide for a first semiconductor device die having a bottom edge incorporating a notch structure that allows sufficient height and width clearance for a wire bond connected to a bond pad on an active surface of a second semiconductor device die upon which the first semiconductor device die is stacked. Use of such notch structures reduces a height of a stack incorporating the first and second semiconductor device die, thereby also reducing a thickness of a semiconductor device package incorporating the stack.

In order to provide multiple functionalities in a semiconductor device package, multiple semiconductor device die can be incorporated in the package. In order to provide the desired functionalities in a package consuming as little floor plan area as possible, the multiple semiconductor device die can be stacked one on top of the other. While decreasing the floor plan area of the semiconductor device package, such a stacked configuration can also increase the height of the semiconductor device package once all the semiconductor device die are encapsulated.

Figure 1:
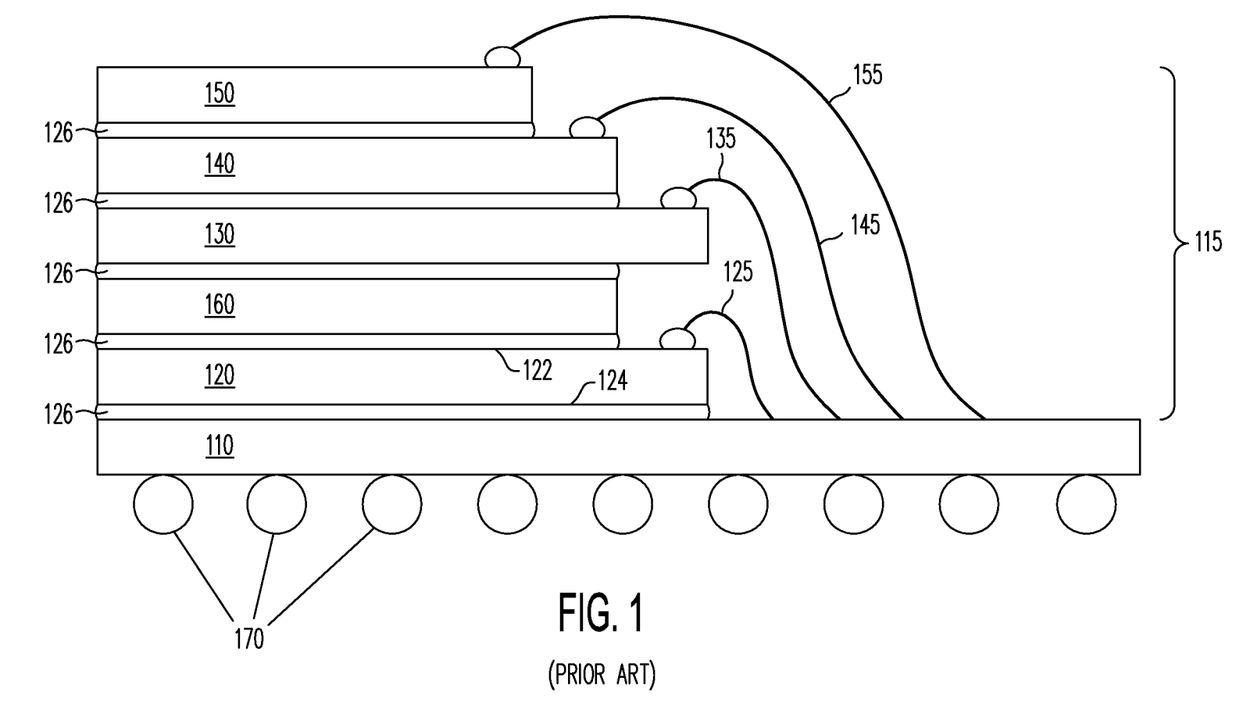
FIG. 1 is a simplified block diagram illustrating an example of a prior art stacked configuration of semiconductor device die.

FIG. 1 is a simplified block diagram illustrating an example of a prior art stacked configuration of semiconductor device die. A package substrate 110 is provided upon which a die stack 115 is mounted. The die stack can be affixed to the package substrate using one of a number of adhesives common in the art. Semiconductor device die 120 is attached to the package substrate. The semiconductor device die of the figures each can include an active side (e.g., 122) and a back side (e.g., 124). The active side of a semiconductor device die is the side on which electronic circuitry is placed. The back side is the side opposite the active side. Back side 124 of semiconductor device die 120 is coupled to substrate 110, using an adhesive layer 126. A wire bond 125 is coupled to a bond pad (not shown) found on an active surface of semiconductor device die 120. Wire bond 125 electrically couples the bond pad to a contact on package substrate 110. Wire bond 125 can be formed from, for example, gold, copper, or aluminum, using techniques common in the art of semiconductor device packaging. External contacts to a package containing die stack 115 are provided through contact balls 170 located on a surface of package substrate 110 opposite that physically coupled to semiconductor device die 120.

The semiconductor device die described herein can be formed of any semiconductor material or combinations of materials, such as gallium arsenide, silicon germanium, silicon-on-insulator (SOI), silicon, monocrystalline silicon, the like, and combinations of the above.

Since wire bond 125 extends above the active surface of semiconductor device die 120, clearance must be provided above the bond pad region in order to avoid disturbing the wire bond when semiconductor device die 130 is added to stack 115. In FIG. 1, clearance between semiconductor device die 120 and semiconductor device die 130 is provided through use of spacer 160. Spacer 160 can take a variety of forms, including, for example, a dummy die. Spacer 160 is attached to a top surface of semiconductor device die 120 (i.e., active surface 122), using an adhesive layer 126. Subsequently, semiconductor device die 130 is attached to a top surface of spacer 160. As illustrated, a thickness of spacer 160 is sufficient to provide clearance for a loop of wire bond 125 between facing surfaces of semiconductor device die 120 and semiconductor device die 130.

Semiconductor device die 130 is also electrically coupled to substrate 110 through use of wire bond 135 coupled to a contact on the active side of semiconductor device die 130. In order to provide clearance for wire bond 135, a smaller semiconductor device die 140 is stacked on semiconductor device die 130. Alternatively, semiconductor device die 140 can be of a same size as semiconductor device die 130, but physically shifted to provide room for wire bond 135. As illustrated, semiconductor device die 140 is also electrically coupled to package substrate 110 through use of a wire bond 145 coupled to a contact on the active side of semiconductor device die 140. Semiconductor device die 150 is subsequently attached to the top surface of semiconductor device die 140 and is either physically smaller than semiconductor device die 140 or offset to permit room for wire bond 145. In addition, semiconductor device die 150 is electrically coupled to package substrate 110 through use of wire bond 155 coupled to a contact on the active side of semiconductor device die 150.

FIG. 1 illustrates that in order to provide room for various wire bonds of a traditional semiconductor device die stack 115, vertical height is consumed through use of a spacer (spacer 160) or care must be taken to use gradually smaller area die within the stack to allow room for wire bonds on lower level semiconductor device die. The need to use smaller and smaller area die as a stack rises can be problematic if multiple semiconductor device die within a package are of similar sizes (e.g., a stack of flash RAM die). Therefore, an alternative that accommodates wire bonds within a stack of similarly-sized die that does not require use of a spacer is desirable.

Figure 2:
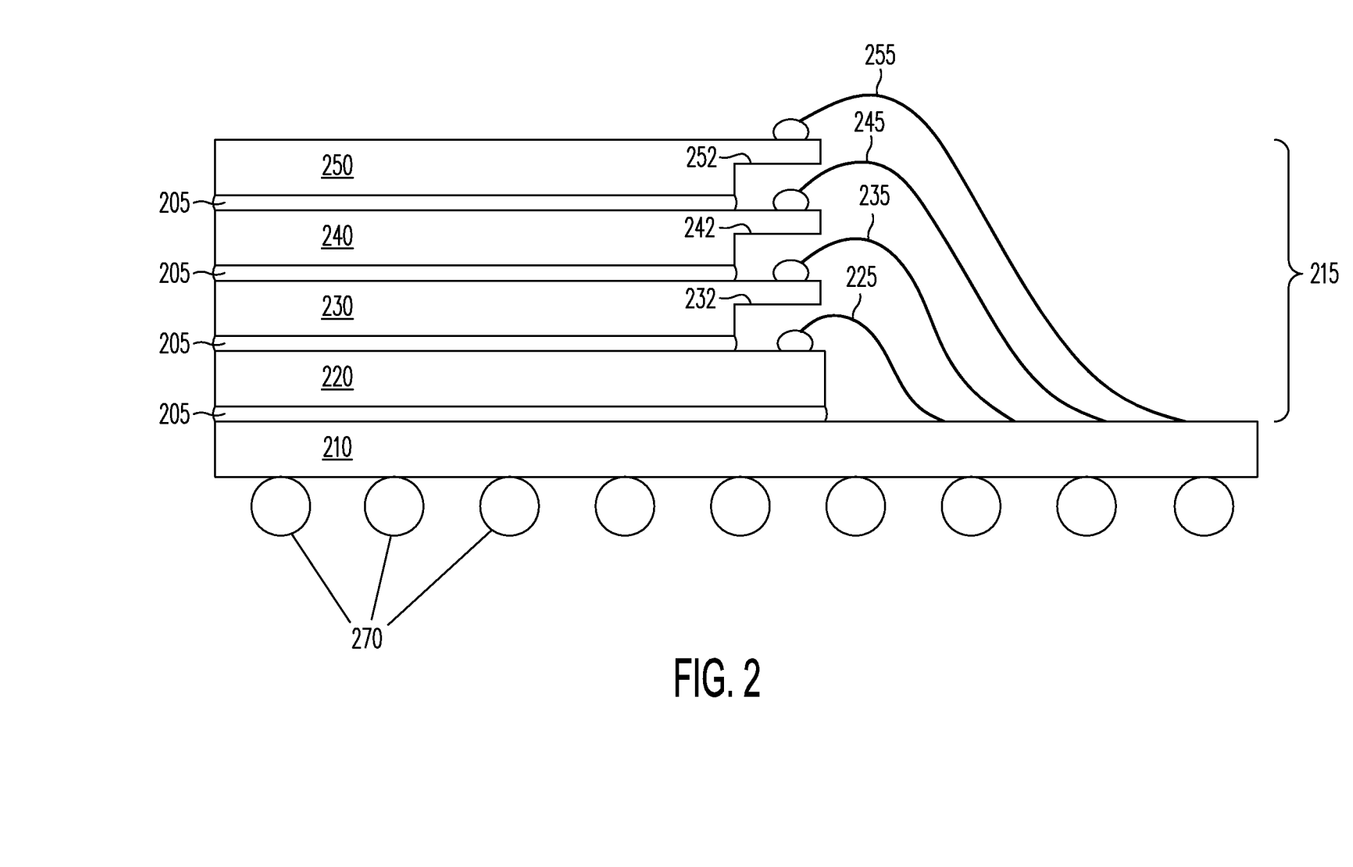
FIG. 2 is a simplified block diagram illustrating one example of a stack of semiconductor device die incorporating one embodiment of the present invention.

FIG. 2 is a simplified block diagram illustrating one example of a stack of semiconductor device die incorporating one embodiment of the present invention. A package substrate 210 is provided upon which a semiconductor device die stack 215 is mounted. Each semiconductor device die within stack 215 can be affixed to a neighboring semiconductor device die using any one of a number of semiconductor device adhesives known in the art (using adhesive layers 205). A semiconductor device die 220 is adhesively mounted to package substrate 210. A bond pad on the active surface of semiconductor device die 220 is electrically coupled to package substrate 210 through use of a wire bond 225. External contacts to a package containing die stack 215 are provided through contact balls 270 located on a surface of package substrate 210 opposite that physically coupled to semiconductor device die 220.

As with the wire bonds of FIG. 1, wire bond 225 has a height above the active surface of semiconductor device die 220 that must be accommodated by any semiconductor device die mounted on top of semiconductor device die 220. Semiconductor device die 230 provide such an accommodation through use of notch structure 232. As will be described more fully below, notch structure 232 is formed on the back side of semiconductor device die 230 to have dimensions sufficient to accommodate wire bond 225, while providing sufficient structural integrity for the edge regions of semiconductor device die 230 and avoiding shorting or touching of wire bond 225 to semiconductor device die 230.

Semiconductor device die 230 is electrically coupled to package substrate 210 through wire bond 235. In another embodiment, semiconductor device die 230 can be electrically coupled to semiconductor device die 220. A semiconductor device die 240 is stacked to the top or active surface of semiconductor device die 230 and provides accommodation for wire bond 235 through use of notch structure 242. Similarly, a semiconductor device die 250 is attached to the top or active surface of semiconductor device die 240 and provides accommodation for a wire bond 245 through use of a notch structure 252. Both semiconductor device die 240 and semiconductor device die 250 are electrically coupled to package substrate 210 or other die in stack 215 through use of wire bonds 245 and 255, respectively.

FIG. 2 illustrates that through use of notch structures 232, 242, and 252, wire bonds formed on active surfaces of semiconductor device die in stack 215 can be accommodated without use of spacers or restricting the area of semiconductor device die in upper portions of stack 215. This allows for incorporation of die of similar size and functionality without a cost of increased thickness of stack 215 or a semiconductor device package incorporating stack 215.

Figure 3:
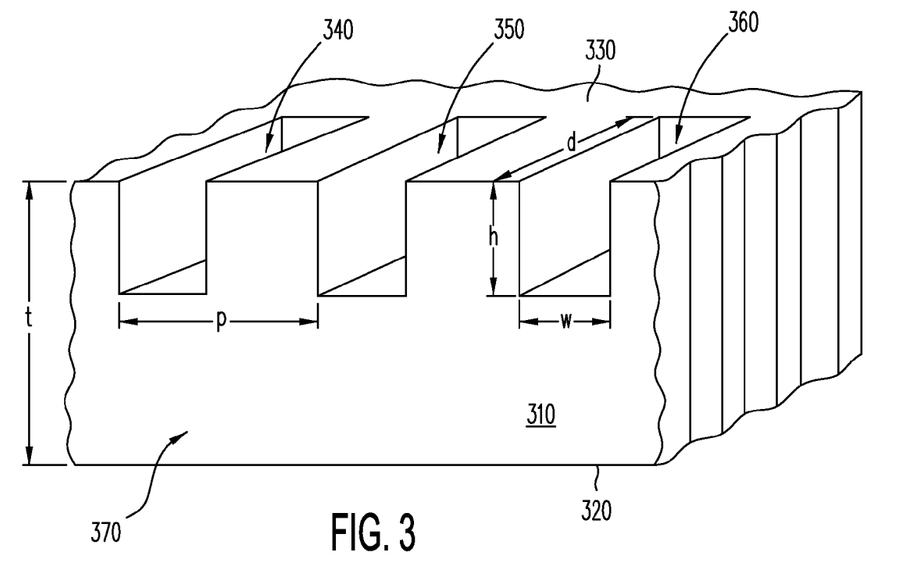
FIG. 3 is a simplified isometric block diagram illustrating an edge region of a semiconductor device die incorporating notches, in accordance with embodiments of the present invention.

FIG. 3 is a simplified isometric block diagram illustrating an edge region of a semiconductor device die incorporating notches, in accordance with embodiments of the present invention. Semiconductor device die 310 includes an active surface 320 and a backside surface 330. Active surface 320 can incorporate bond pads and other contacts not shown. The portion of semiconductor device die 310 illustrated includes notch structures 340, 350, and 360. The notch structures are formed to have a height h of each notch extending perpendicularly from back side surface 330 to within the semiconductor material of semiconductor device die 310. The notch structures are also formed to have a depth d of each notch extending perpendicularly from an edge 370 to within the semiconductor material of semiconductor device die 310. Further, the notch structures are formed to have a width w between walls of each notch structure.

Semiconductor device die 310 has a thickness t that incorporates all the structures of the semiconductor device die. In order to ensure structural integrity of the semiconductor material above notch structures 340, 350, and 360, one embodiment of the present invention provides for a height h of the notch structures less than or equal to one half thickness t. A typical semiconductor device die thickness is on the order of 200 μm, therefore a corresponding height h could be less than or equal to 100 μm. FIG. 3 also provides regularly-spaced notch structures along the edge of semiconductor device die 310, having a pitch p. In order to enhance structural integrity of the semiconductor material surrounding notch structures 340, 350, and 360, one embodiment of the present invention provides for width w of the notch structures being less than or equal to one-half pitch p. In one embodiment, bond pads can be placed on the active surface of semiconductor device die 310 in regions not above the notch structures, thereby taking advantage of the greater structural integrity in the offset regions. In another embodiment, the bond pads can be placed in regions directly above the notch structures.

Notch structures 340, 350, and 360 are formed on backside surface 330 of semiconductor device die 310 during fabrication of a way for incorporating semiconductor device die 310. Notch structures can be formed using a variety of techniques known in the art. Such techniques can include, for example, photolithography for defining location and shapes of the notch structures, followed by use of one or more of a wet etch or a dry etch. Alternatively, mechanical drilling, or laser ablation type techniques can be used, but can involve additional processing steps that may not be desirable for all fabrication environments.

It should be noted that while some figures in the present application show straight edges along with sharp corners within various notch structures, it is recognized that techniques used to form the notch structures can provide rounded edges and rougher sidewalls within the notches. Such rounded edges and rougher sidewalls are contemplated to be within the scope of embodiments or aspects of embodiments of the present invention.

Figure 4:
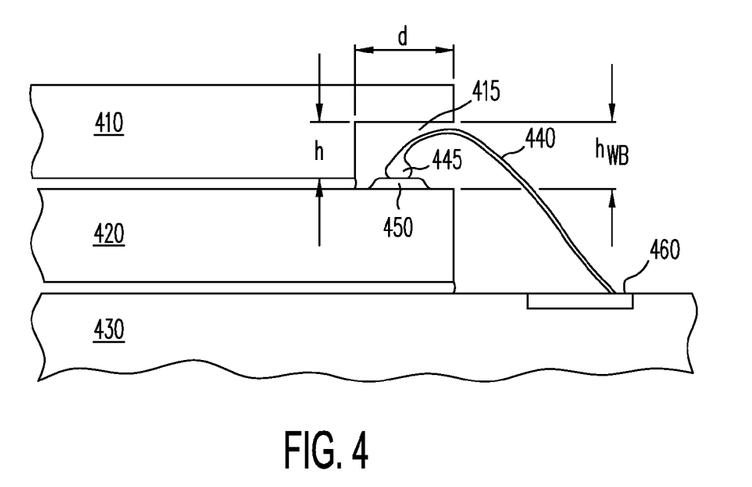
FIG. 4 is a simplified block diagram illustrating a cross-section of a semiconductor device stack incorporating a semiconductor device die having a notch, in accordance with embodiments of the present invention.

FIG. 4 is a simplified block diagram illustrating a cross-section of a semiconductor device stack incorporating a semiconductor device die having a notch, in accordance with embodiments of the present invention. The semiconductor device die 410 includes a notch structure 415 having a height h and a depth d. Semiconductor device die 410 is stacked above an active surface of semiconductor device die 420. Semiconductor device die 420 is in turn stacked on a package substrate or other semiconductor device 430. A bond pad 450 on the active surface of semiconductor device die 420 is electrically coupled to a contact 460 on package substrate or other semiconductor device 430 through a wire bond 440. Wire bond 440 includes a bond 445 (e.g., a ball bond) bonded to bond pad 450.

The dimensions of notch structure 415 should accommodate wire bond 440. As illustrated, due to the size of bond 445, bond pad 450, and a wire bond loop 440 above bond 445, wire bond 440 has a wire bond height $h_{wb}$. Thus, notch height h should be greater than wire bond height $h_{wb}$. Further, notch depth d should be sufficient to clear bond pad 450 and a length of wire bond loop 440.

In one embodiment, in order to ensure that a wire bond (e.g. wire bond 440) does not short or touch against the semiconductor material of semiconductor device die 410, an oxide layer can be formed on the exposed walls of notch structure 415. An oxide layer can be formed using a variety of techniques known in the art, for example, heating the semiconductor device die in the presence of oxygen subsequent to formation of the notch structures in a panel incorporating the semiconductor device die. In such a configuration, a wire bond could contact the surface of notch structure 415 without shorting or touching against semiconductor device die 410.

Figure 5:
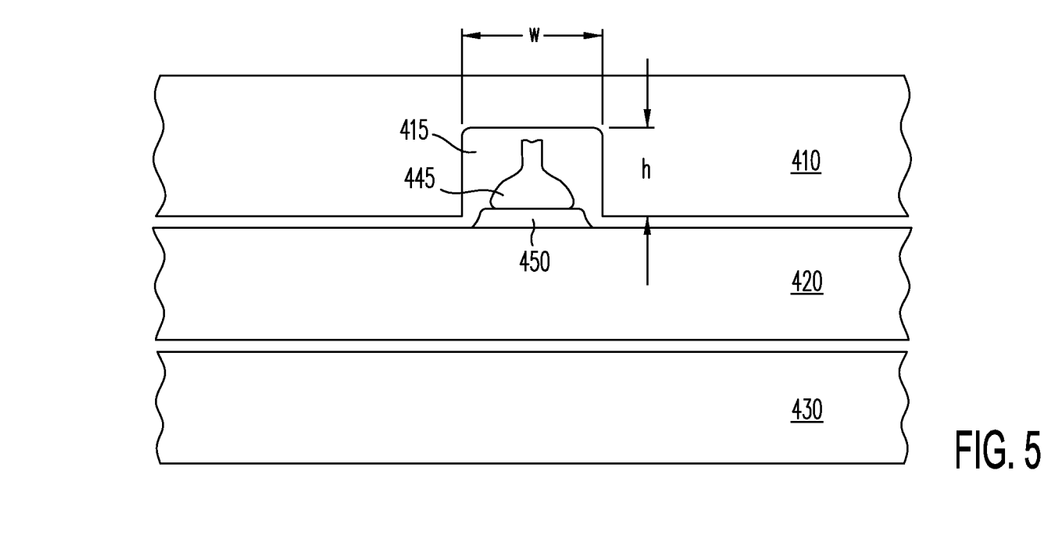
FIG. 5 is a simplified block diagram illustrating a an end view of a semiconductor device stack incorporating a semiconductor device die having a notch, in accordance with embodiments of the present invention.

FIG. 5 is a simplified block diagram illustrating an end view of the semiconductor device stack of FIG. 4. Notch structure 415 is illustrated as having height h and width w. Notch width w should be sufficient to accommodate both a width of bond pad 450 and a width of bond 445 subsequent to formation of the wire bond. A typical dimension of a ball bond is on the order of 15-30 µm in diameter, but is dependent upon the nature of the application and material used to form the wire bond (e.g., gold or copper).

Figure 6:
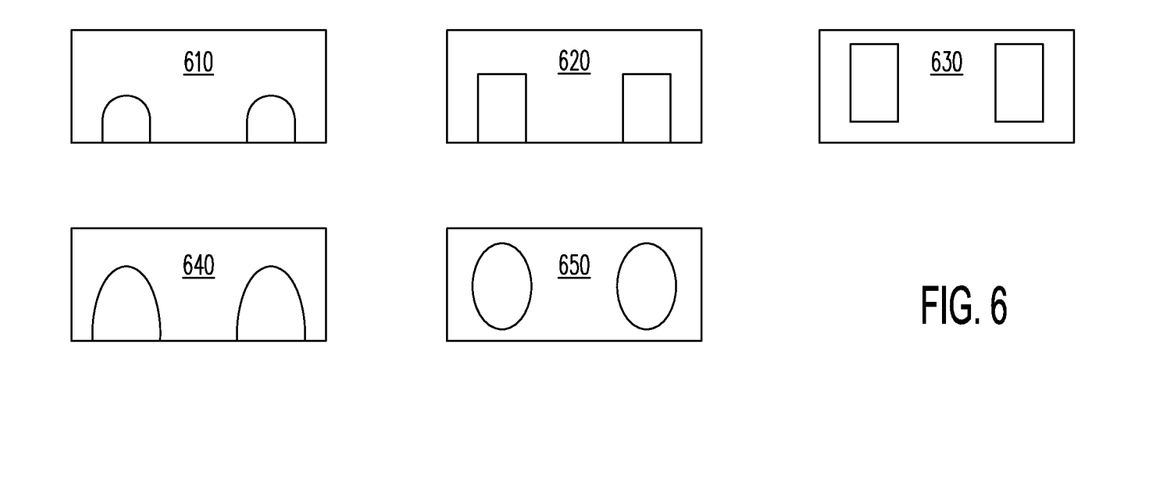
FIG. 6 is a simplified block diagram illustrating plan view of examples of notch structure shapes, in accordance with embodiments of the present invention.

FIG. 6 is a simplified block diagram illustrating plan views of examples of notch structure shapes, in accordance with embodiments of the present invention. Different applications may suggest use of different shaped notch structures to accommodate bond pads, bond balls, wire bonds, and potential deviations of positions of one or more of those structures. Notch structure 610 is an example of a half round or extended round notch structure at an edge of a semiconductor device die. Notch structure 620 is a rectangular notch structure at an edge of a semiconductor device die. Alternatively, notch structure 630 provides a rectangular notch inside a body of a semiconductor device die. Notch structure 640 is an oval notch at an edge of a semiconductor device die. Finally, notch structure 650 is an example of an oval notch inside a body of a semiconductor device die. Embodiments of the present invention are not limited to this set of examples of notch structures, but instead these examples are provided to illustrate the variety that can be obtained through embodiments of the present invention.

Different applications may implicate different notch structures. For example, notch structure 640 can provide flexibility for wire bonds to fan out in a variety of directions from a bond pad. The variety of shapes can be obtained through use of different photolithography masks and etching techniques, or drilling, as implicated by the fabrication processes utilized. Further, an advantage of oval or rounded edge notch structures can include lower material stress over rectangular edge notch structures at corner regions of the rectangular edge structures.

Figure 7:
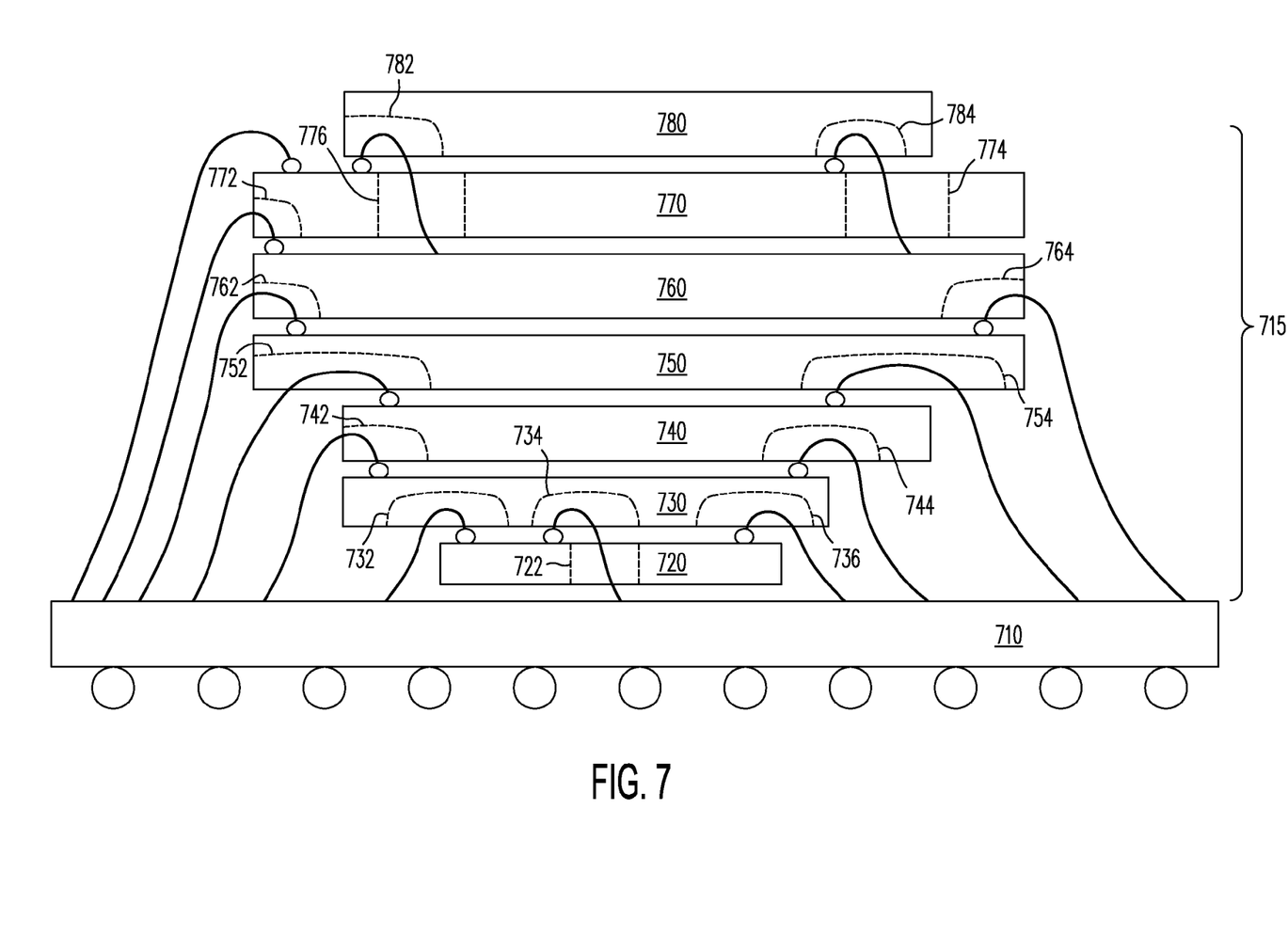
FIG. 7 is a cross-sectional block diagram illustrating an example of a semiconductor device stack using one or more of the variety of notch structures illustrated in FIG. 6, in accord with embodiments of the present invention.

FIG. 7 is a cross-sectional block diagram illustrating an example of a semiconductor device stack using one or more of the variety of notch structures illustrated in FIG. 6, in accord with embodiments of the present invention. Package substrate 710 has affixed thereto a semiconductor device stack 715. Semiconductor device stack 715 includes a semiconductor device die 720, 730, 740, 750, 760, 770, and 780. A variety of wire bond connections are made from active surfaces of each of the various semiconductor device die and a corresponding variety of notch structures are provided to accommodate those wire bonds. For example, notch structure 732 is a recess within the perimeter of semiconductor device die 730, as is notch structure 734 and 736. The semiconductor device die 740 includes notch structure 742, which is a pocket recess on an edge of the semiconductor device die and a notch structure 744, which is a recess within the periphery of the semiconductor device die. Semiconductor device die 750 includes a notch structure 752, which is a long recess along an edge of the die and a notch structure 754, which is a long recess within a die periphery. The depth of the various notch structures, such as notch structures 752 and 754, is dictated by the dimensions of the wire bond being accommodated by the corresponding notch structure. Similarly, notch structures 762 and 764 on semiconductor device die 760, notch structures 772 and 774 on semiconductor device die 770, and notch structures 782 and 784 on semiconductor device die 780 are sized and placed to accommodate the various corresponding wire bonds located on the semiconductor device die active surfaces in contact with those semiconductor device die. Placement and dimensions of notch structures are anticipated to be dictated by the wire bonds being accommodated by those notch structures.

Semiconductor device die incorporating the notch structures of the present invention can provide for semiconductor device die stacks within semiconductor device packages of significantly reduced thickness or overall height as compared to stacks of the prior art. In addition, use of notch structures that are spaced by a pitch and incorporate sidewall structures between the notches results in a greater overall structural integrity of the edge region of the semiconductor device die over die structures that remove all of the semiconductor material in an edge region up to a certain point. Thus, bond pads can be placed in a region above the edge that can withstand pressures associated with wire bonding in excess of those die can be withstood by die having all the material removed beneath the edge region. As thicknesses of semiconductor device die become smaller, retention of structural integrity will become of greater import in light of overall material strength.

By now it should be appreciated that there has been provided a semiconductor device package that includes a first semiconductor device die having a first major surface and a second major surface opposite and having a substantially parallel plane to the first major surface where the first major surface includes a first bond pad; a wire bond coupled to the first bond pad; and, a second semiconductor device die having a first major surface and a second major surface opposite and having a substantially parallel plane to the first major surface. The wire bond has a bond in contact with the first bond pad and a wire bond loop extending a vertical height from the bond and a horizontal distance from the bond over the first major surface of the first semiconductor device die. The second major surface of the second semiconductor device die is attached to the first major surface of the first semiconductor device die. The second major surface includes a notch structure in a region above the first bond pad of the first semiconductor device die and the wire bond coupled to the first bond pad, and the notch structure has a length and width less than corresponding dimensions of the second semiconductor device die. The wire bond clears the second semiconductor device die by virtue of being within the notch structure.

One aspect of the above embodiment further includes an oxide coating formed on the notch structure surface on the second semiconductor device die.

In another aspect of the above embodiment, the notch structure provides a surface in the second semiconductor device die extending to a depth within the second semiconductor device die greater than or equal to the vertical height of the wire bond loop, a length along the second major surface of the second semiconductor device die greater than or equal to the horizontal distance of the wire bond loop over the first major surface of the first semiconductor device die, and a width along the second major surface of the second semiconductor device die greater than a width of the bond and less than a parallel dimension of the second semiconductor device die. A further aspect provides a plurality of bond pads formed on the first major surface of the first semiconductor device die where the plurality of bond pads includes the first bond pad, a plurality of wire bonds where each is coupled to one of the plurality of bond pads, and a plurality of notch structures on the second major surface of the second semiconductor device die. Each notch structure of the plurality of notch structures corresponds to a bond bad on the first semiconductor device die. In a still further aspect, the plurality of bond pads are positioned along an edge of the first major surface of the first semiconductor device die, the plurality of bond pads are regularly spaced by a pitch distance, and a width of each notch structure corresponding to each of the bond pads is less than or equal to one half of the pitch distance.

In another further aspect, the first and second major surfaces of the second semiconductor device die are separated by a thickness t, and the notch structure depth is less than or equal to one-half the thickness t of the second semiconductor device die.

Another aspect of the above embodiment further includes a third semiconductor device die that has a first major surface and a second major surface opposite and having a substantially parallel plane to the first major surface. The second major surface of the third semiconductor device die is attached to the first major surface of the second semiconductor device die. The first major surface of the second semiconductor device die has a second bond pad and a second wire bond coupled to the second bond pad. The second wire bond has a second bond in contact with the second bond pad and a second wire bond loop extending a second vertical height from the second bond and a second horizontal distance from the second bond over the first major surface of the second semiconductor device die. The second major surface of the third semiconductor device die has a second notch structure in a region above the second bond pad of the second semiconductor device die and the second wire bond coupled to the second bond pad. The second notch structure provides a surface in the third semiconductor device die extending to a depth within the third semiconductor device die greater than or equal to the second vertical height of the second wire bond loop, a length along the second major surface of the third semiconductor device die greater than or equal to the second horizontal distance of the wire bond loop over the first major surface of the first semiconductor device die, and a width along the second major surface of the second semiconductor device die greater than a width of the bond and less than a parallel dimension of the second semiconductor device die.

Another aspect of the above embodiment includes a package substrate where the second major surface of the first semiconductor device die is attached to a first major surface of the package substrate, and encapsulant over and around the second semiconductor device die, around the first semiconductor device die, and over the first major surface of the package substrate, where the encapsulant forms an encapsulated region of the semiconductor device package.

Another embodiment of the present invention provides a method for forming a semiconductor device package that includes a first and second semiconductor device die. The method includes coupling a wire bond to a first bond pad on a first major surface of the first semiconductor device die, and attaching a second major surface of the second semiconductor device die to the first major surface of the first semiconductor device die. The wire bond includes a bond in contact with the first bond pad and a wire loop extending a vertical height from the bond and a horizontal distance from the bond over the first major surface of the first semiconductor device die. The second major surface of the second semiconductor device die includes a notch structure in a region above the first bond pad of the first semiconductor device die and the wire bond coupled to the first bond pad. The notch structure provides a surface in the second semiconductor device die extending to a depth within the second semiconductor device die greater than or equal to the vertical height of the wire bond loop, a length along the second major surface of the second semiconductor device die greater than or equal to the horizontal distance of the wire bond loop over the first major surface of the first semiconductor device die, and a width along the second major surface of the second semiconductor device die greater than a width of the bond and less than a parallel dimension of the second semiconductor device die.

In one aspect of the above embodiment, the method further includes forming an oxide layer on the notch surface on the second semiconductor device. die. Another aspect further includes coupling one or more additional wire bonds to corresponding bond pads on the first major surface of the first semiconductor device die. Each wire bond includes a bond in contact with the corresponding bond pad and a wire loop extending a corresponding vertical height from the bond and a corresponding horizontal distance from the bond over the first major surface of the first semiconductor device die. The second major surface of the second semiconductor device die includes corresponding notch structures in a region above the corresponding bond pads of the first semiconductor device die and the wire bonds coupled to the first bond pad. In a further aspect, the plurality of corresponding bond pads are positioned along an edge of the first major surface of the first semiconductor device die, the plurality of bond pads are regularly spaced by a pitch distance, and the width of each notch structure corresponding to each of the bond pads is less than or equal to one half of the pitch distance.

In another aspect of the above embodiment, the second semiconductor device die the second semiconductor device die includes a first major surface and the second major surface is opposite and having a substantially parallel plane to the first major surface and the first and second major surfaces of the second semiconductor device die are separated by a thickness t, and the notch structure depth is less than or equal to one-half the thickness t of the second semiconductor device die.

In yet another aspect of the above embodiment, the method further includes: coupling a second wire bond to a second bond pad on a first major surface of the second semiconductor device die; and, attaching a second major surface of a third semiconductor device die to the first major surface of the second semiconductor device die. The second wire bond includes a second bond in contact with the second bond pad and a second wire loop extending a vertical height from the second bond and a horizontal distance from the second bond over the first major surface of the second semiconductor device die. The second major surface of the third semiconductor device die includes a second notch structure in a region above the second bond pad of the second semiconductor device die and the second wire bond coupled to the second bond pad. The second notch structure provides a surface in the third semiconductor device die extending to a depth within the third semiconductor device die greater than or equal to the vertical height of the second wire bond loop, a length along the second major surface of the third semiconductor device die greater than or equal to the horizontal distance of the second wire bond loop over the first major surface of the second semiconductor device die, and a width along the second major surface of the third semiconductor device die greater than a width of the second bond and less than a parallel dimension of the third semiconductor device die.

In another aspect of the above embodiment, the method further includes attaching a second major surface of the first semiconductor device die to a first major surface of a package substrate where the second major surface of the first semiconductor device die is opposite and having a substantially parallel plane to the second major surface of the first semiconductor device die, and forming an encapsulant over and around the second semiconductor device die, around the first semiconductor device die, and over the first major surface of the package substrate.

Another embodiment of the present invention provides for a first semiconductor device die and a second semiconductor device die. The first semiconductor device die includes a first major surface and a second major surface opposite the first major surface, a first minor surface and a second minor surface opposite the first minor surface where the first and second minor surfaces extend between the first and second major surfaces, and a plurality of notch structures extending into a volume of the first semiconductor device die from the second major surface between the first and second minor surfaces. Each notch structure of the plurality of notch structures has a notch depth measured from the second major surface into the first semiconductor device die and, for each notch structure, the notch depth is less than or equal to one-half a thickness of the first semiconductor device die measured between the first and second major surfaces. Each notch structure of the plurality of notch structures has a notch length measured along a dimension of the semiconductor device die between the first and second minor surfaces wherein, for each notch structure, the notch length is less than a length of the first semiconductor device die as measured between the first and second major surfaces. Each notch structure of the plurality of notch structures has a maximum notch width measured along the second major surface of the semiconductor device die and approximately perpendicular to the notch length of that notch structure. The second semiconductor device die includes a first major surface and a second major surface opposite the first major surface, a second plurality of contact pads on the first major surface of the second semiconductor device die, and one or more wire bonds coupled to corresponding contact pads of the second plurality of contact pads wherein each wire bond comprises a corresponding bond in contact with the corresponding contact pad and a corresponding wire bond loop extending a vertical height from the corresponding bond and a horizontal distance from the corresponding bond over the first major surface of the second semiconductor device die. The second major surface of the first semiconductor device die is adhesively coupled to the first major surface of the second semiconductor device die, such that each of the one or more wire bonds is located in a corresponding notch structure.

In one aspect of the above embodiment, a set of the second plurality of contact pads are located along an edge of the first major surface of the second semiconductor device die, each of the set of the second plurality of contact pads are spaced apart by a contact pitch distance p, and the maximum notch width of the notch structures corresponding to the set of the second plurality of contact pads is less than or equal to one-half the contact pitch distance p. In a further aspect, the first semiconductor device die further includes a plurality of contact pads on the first major surface of the first semiconductor device die located along an edge of the first semiconductor device die including the notch structures. A contact pad of the plurality of contact pads is located over a region between two notch structures.

Another aspect of the above embodiment further includes an oxide coating one or more surfaces within each notch structure corresponding to a wire bond, where the oxide coating is configured to prevent a short between the wire bond and the first semiconductor device die. In another aspect of the above embodiment, one or more notch structures includes a curved edge.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, notch structures can be of varying shapes and number, and a variable number of semiconductor device die can be included in a package. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
   a first semiconductor device die comprising a first major surface and a second major surface opposite and having a substantially parallel plane to the first major surface, wherein the first major surface comprises a first bond pad;
   a wire bond coupled to the first bond pad, wherein
      the wire bond comprises a bond in contact with the first bond pad and a wire bond loop extending a vertical height from the bond and a horizontal distance from the bond over the first major surface of the first semiconductor device die; and
   a second semiconductor device die comprising a first major surface and a second major surface opposite and having a substantially parallel plane to the first major surface, wherein
      the second major surface of the second semiconductor device die is attached to the first major surface of the first semiconductor device die,
      the second major surface of the second semiconductor device die comprises a notch structure in a region above the first bond pad of the first semiconductor device die and the wire bond coupled to the first bond pad,
      the wire bond clears the second semiconductor device die by virtue of being within the notch structure,
      a length and width of the notch structure are less than corresponding dimensions of the second semiconductor device die, and
      the notch structure provides a surface in the second semiconductor device die extending to a depth within the second semiconductor device die greater than or equal to the vertical height of the wire bond loop, a length along the second major surface of the second semiconductor device die greater than or equal to the horizontal distance of the wire bond loop over the first major surface of the first semiconductor device die, and a width along the second major surface of the second semiconductor device die greater than a width of the bond and less than a parallel dimension of the second semiconductor device die.

2. The semiconductor device package of claim 1 further comprising:
   an oxide coating formed on the notch structure surface on the second semiconductor device die.

3. The semiconductor device package of claim 1 further comprising:
   a plurality of bond pads formed on the first major surface of the first semiconductor device die, wherein the plurality of bond pads comprises the first bond pad;
   a plurality of wire bonds, each coupled to one of the plurality of bond pads; and
   a plurality of notch structures on the second major surface of the second semiconductor device die, wherein each notch structure of the plurality of notch structures corresponds to a bond pad on the first semiconductor device die.

4. The semiconductor device die of claim 3, wherein
   the plurality of bond pads are positioned along an edge of the first major surface of the first semiconductor device die,
   the plurality of bond pads are regularly spaced by a pitch distance, and
   a width of each notch structure corresponding to each of the bond pads is less than or equal to one half of the pitch distance.

5. The semiconductor device die of claim 1, wherein
   the first and second major surfaces of the second semiconductor device die are separated by a thickness t, and
   the notch structure depth is less than or equal to one-half the thickness t of the second semiconductor device die.

6. A semiconductor device package comprising:
   a first semiconductor device die comprising a first major surface and a second major surface opposite and having a substantially parallel plane to the first major surface, wherein the first major surface comprises a first bond pad;
   a wire bond coupled to the first bond pad, wherein
      the wire bond comprises a bond in contact with the first bond pad and a wire bond loop extending a vertical height from the bond and a horizontal distance from the bond over the first major surface of the first semiconductor device die; and
   a second semiconductor device die comprising a first major surface and a second major surface opposite and having a substantially parallel plane to the first major surface, wherein
      the second major surface of the second semiconductor device die is attached to the first major surface of the first semiconductor device die,
      the second major surface of the second semiconductor device die comprises a notch structure in a region above the first bond pad of the first semiconductor device die and the wire bond coupled to the first bond pad,
      the wire bond clears the second semiconductor device die by virtue of being within the notch structure,
      a length and width of the notch structure are less than corresponding dimensions of the second semiconductor device die; and
   a third semiconductor device die comprising a first major surface and a second major surface opposite and having a substantially parallel plane to the first major surface, wherein
      the second major surface of the third semiconductor device die is attached to the first major surface of the second semiconductor device die,
      the first major surface of the second semiconductor device die comprises a second bond pad and a second wire bond coupled to the second bond pad,
      the second wire bond comprises a second bond in contact with the second bond pad and a second wire bond loop extending a second vertical height from the second bond and a second horizontal distance from the second bond over the first major surface of the second semiconductor device die,
      the second major surface of the third semiconductor device die comprises a second notch structure in a region above the second bond pad of the second semiconductor device die and the second wire bond coupled to the second bond pad,
      the second notch structure provides a surface in the third semiconductor device die extending to a depth within the third semiconductor device die greater than or equal to the second vertical height of the second wire bond loop, a length along the second major surface of the third semiconductor device die greater than or equal to the second horizontal distance of the wire bond loop over the first major surface of the first semiconductor device die, and a width along the second major surface of the second semiconductor device die greater than a width of the bond and less than a parallel dimension of the second semiconductor device die.

7. A semiconductor device package comprising:
a first semiconductor device die comprising a first major surface and a second major surface opposite and having a substantially parallel plane to the first major surface, wherein the first major surface comprises a first bond pad;
a wire bond coupled to the first bond pad, wherein
the wire bond comprises a bond in contact with the first bond pad and a wire bond loop extending a vertical height from the bond and a horizontal distance from the bond over the first major surface of the first semiconductor device die; and
a second semiconductor device die comprising a first major surface and a second major surface opposite and having a substantially parallel plane to the first major surface, wherein
the second major surface of the second semiconductor device die is attached to the first major surface of the first semiconductor device die,
the second major surface of the second semiconductor device die comprises a notch structure in a region above the first bond pad of the first semiconductor device die and the wire bond coupled to the first bond pad,
the wire bond clears the second semiconductor device die by virtue of being within the notch structure,
a length and width of the notch structure are less than corresponding dimensions of the second semiconductor device die; and
a package substrate wherein the second major surface of the first semiconductor device die is attached to a first major surface of the package substrate; and
encapsulant over and around the second semiconductor device die, around the first semiconductor device die, and over the first major surface of the package substrate, wherein the encapsulant forms an encapsulated region of the semiconductor device package.

8. A method for forming a semiconductor device package including a first and second semiconductor device die, the method comprising:
coupling a wire bond to a first bond pad on a first major surface of the first semiconductor device die, wherein
the wire bond comprises a bond in contact with the first bond pad and a wire loop extending a vertical height from the bond and a horizontal distance from the bond over the first major surface of the first semiconductor device die;
attaching a second major surface of the second semiconductor device die to the first major surface of the first semiconductor device die, wherein
the second major surface of the second semiconductor device die comprises a notch structure in a region above the first bond pad of the first semiconductor device die and the wire bond coupled to the first bond pad, and
the notch structure provides a surface in the second semiconductor device die extending to a depth within the second semiconductor device die greater than or equal to the vertical height of the wire bond loop, a length along the second major surface of the second semiconductor device die greater than or equal to the horizontal distance of the wire bond loop over the first major surface of the first semiconductor device die, and a width along the second major surface of the second semiconductor device die greater than a width of the bond and less than a parallel dimension of the second semiconductor device die.

9. The method of claim 8 further comprising:
forming an oxide layer on the notch surface on the second semiconductor device die.

10. The method of claim 8 further comprising:
coupling one or more additional wire bonds to corresponding bond pads on the first major surface of the first semiconductor device die, wherein
each wire bond comprises a bond in contact with the corresponding bond pad and a wire loop extending a corresponding vertical height from the bond and a corresponding horizontal distance from the bond over the first major surface of the first semiconductor device die, and
the second major surface of the second semiconductor device die comprises corresponding notch structures in a region above the corresponding bond pads of the first semiconductor device die and the wire bonds coupled to the first bond pad.

11. The method of claim 10, wherein
the plurality of corresponding bond pads are positioned along an edge of the first major surface of the first semiconductor device die,
the plurality of bond pads are regularly spaced by a pitch distance, and
the width of each notch structure corresponding to each of the bond pads is less than or equal to one half of the pitch distance.

12. The method of claim 8, wherein
the second semiconductor device die comprises a first major surface and the second major surface opposite and having a substantially parallel plane to the first major surface and the first and second major surfaces of the second semiconductor device die are separated by a thickness t, and
the notch structure depth is less than or equal to one-half the thickness t of the second semiconductor device die.

13. The method of claim 8 further comprising:
coupling a second wire bond to a second bond pad on a first major surface of the second semiconductor device die, wherein
the second wire bond comprises a second bond in contact with the second bond pad and a second wire loop extending a vertical height from the second bond and a horizontal distance from the second bond over the first major surface of the second semiconductor device die;
attaching a second major surface of a third semiconductor device die to the first major surface of the second semiconductor device die, wherein
the second major surface of the third semiconductor device die comprises a second notch structure in a region above the second bond pad of the second semiconductor device die and the second wire bond coupled to the second bond pad, and
the second notch structure provides a surface in the third semiconductor device die extending to a depth within the third semiconductor device die greater than or equal to the vertical height of the second wire bond loop, a length along the second major surface of the third semiconductor device die greater than or equal to the horizontal distance of the second wire bond loop over the first major surface of the second semiconductor device die, and a width along the second major surface of the third semiconductor device die greater than a width of the second bond and less than a parallel dimension of the third semiconductor device die.

14. The method of claim 8 further comprising:
attaching the second major surface of the first semiconductor device die to a first major surface of a package substrate, wherein the second major surface of the first semiconductor device die is opposite and having a substantially parallel plane to the second major surface of the first semiconductor device die; and
forming encapsulant over and around the second semiconductor device die, around the first semiconductor device die, and over the first major surface of the package substrate.

15. A semiconductor device comprising:
a first semiconductor device die comprising
    a first major surface and a second major surface opposite the first major surface,
    a first minor surface and a second minor surface opposite the first minor surface wherein the first and second minor surfaces extend between the first and second major surface, and
    a plurality of notch structures extending into a volume of the first semiconductor device die from the second major surface between the first and second minor surfaces, wherein
        each notch structure of the plurality of notch structures has a notch depth measured from the second major surface into the first semiconductor device die and, for each notch structure, the notch depth is less than or equal to one-half a thickness of the first semiconductor device die measured between the first and second major surfaces,
        each notch structure of the plurality of notch structures has a notch length measured along a dimension of the semiconductor device die between the first and second minor surfaces wherein, for each notch structure, the notch length is less than a length of the first semiconductor device die as measured between the first and second major surfaces,
        each notch structure of the plurality of notch structures has a maximum notch width measured along the second major surface of the semiconductor device die and approximately perpendicular to the notch length of that notch structure; and
a second semiconductor device die comprising
    a first major surface and a second major surface opposite the first major surface,
    a second plurality of contact pads on the first major surface of the second semiconductor device die,
    one or more wire bonds coupled to corresponding contact pads of the second plurality of contact pads wherein each wire bond comprises a corresponding bond in contact with the corresponding contact pad and a corresponding wire bond loop extending a vertical height from the corresponding bond and a horizontal distance from the corresponding bond over the first major surface of the second semiconductor device die, wherein
        the second major surface of the first semiconductor device die is adhesively coupled to the first major surface of the second semiconductor device die such that each of the one or more wire bonds is located in a corresponding notch structure.

16. The semiconductor device of claim 15, wherein
a set of the second plurality of contact pads are located along an edge of the first major surface of the second semiconductor device die,
each of the set of the second plurality of contact pads are spaced apart by a contact pitch distance p,
the maximum notch width of the notch structures corresponding to the set of the second plurality of contact pads is less than or equal to one-half the contact pitch distance p.

17. The semiconductor device of claim 16 wherein the first semiconductor device die further comprises:
a plurality of contact pads on the first major surface of the first semiconductor device die located along an edge of the first semiconductor device die comprising the notch structures, wherein
    a contact pad of the plurality of contact pads is located over a region between two notch structures.

18. The semiconductor device of claim 15 further comprising:
an oxide coating one or more surfaces within each notch structure corresponding to a wire bond, wherein the oxide coating is configured to prevent a short between the wire bond and the first semiconductor device die.

19. The semiconductor device of claim 15, wherein
one or more notch structure comprises a curved edge.

* * * * *